(12) United States Patent
Kihara et al.

(10) Patent No.: US 8,026,120 B2
(45) Date of Patent: Sep. 27, 2011

(54) METHOD OF MANUFACTURING MEMS DEVICE

(75) Inventors: Ryuji Kihara, Matsumoto (JP); Shogo Inaba, Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 12/684,248

(22) Filed: Jan. 8, 2010

(65) Prior Publication Data
US 2010/0178717 A1 Jul. 15, 2010

(30) Foreign Application Priority Data

Jan. 14, 2009 (JP) ................. 2009-005408

(51) Int. Cl.
*H01L 21/00* (2006.01)

(52) U.S. Cl. ........ 438/50; 438/52; 438/53; 257/E21.531

(58) Field of Classification Search .............. 438/48, 438/50, 51, 52, 53; 257/E21.531
See application file for complete search history.

(56) References Cited

U.S. PATENT DOCUMENTS

| 6,628,179 | B2 * | 9/2003 | Yatsuda et al. ............ 333/193 |
| 7,102,467 | B2 | 9/2006 | Lutz et al. |
| 7,221,241 | B2 | 5/2007 | Lutz et al. |
| 2008/0105951 | A1 * | 5/2008 | Sato et al. ................ 257/619 |
| 2008/0257497 | A1 * | 10/2008 | Shimaoka et al. ....... 156/345.29 |

FOREIGN PATENT DOCUMENTS

| JP | 2005123561 | * | 5/2005 |
| JP | 2007-535275 | | 11/2007 |
| JP | 2008-114354 | | 5/2008 |
| WO | WO2005-109639 | | 11/2005 |

OTHER PUBLICATIONS

S. Chowdhury, M. Ahmadi and W. C. Miller, "A Closed-Form Model for The Pull-in Voltage of Electrostatically Actuated Cantilever Beams", Journal of Micromechanics and Microengineering, 2005, pp. 756-763, vol. 15.

Daphne Joachim, Liwei Lin, "Characterization of Selective Polysilicon Deposition for MEMS Resonator Tuning", Journal of Micromechanical Systems, Apr. 2003, pp. 193-200, vol. 12, No. 2, IEEE.

* cited by examiner

*Primary Examiner* — Michael Trinh
(74) *Attorney, Agent, or Firm* — Harness, Dickey & Pierce, P.L.C.

(57) ABSTRACT

A method of manufacturing an MEMS device includes: forming a covering structure having an MEMS structure and a hollow portion, which is located on a periphery of the MEMS structure and is opened to an outside, on a substrate; and performing surface etching for the MEMS structure in a gas phase by supplying an etching gas to the periphery of the MEMS structure from the outside.

7 Claims, 7 Drawing Sheets

METHOD OF MANUFACTURING MEMS DEVICE

BACKGROUND

1. Technical Field

The present invention relates to a method of manufacturing an MEMS device, and more particularly, to a manufacturing process for adjusting the structural size of an MEMS structure.

2. Related Art

MEMS (Micro Electro Mechanical Systems) relate to one of the technologies for forming micro structures. For example, MEMS relate to technology for producing a delicate electromechanical system of a micron order or such products. Generally, semiconductor chips have a circuit structure that is a two-dimensional pattern by manufacturing an electronic circuit by stacking thin films such as a silicon film, an oxidation film, and a metal film on a silicon substrate. However, when the technology for manufacturing the semiconductor chip, that is, semiconductor manufacturing technology is used in the MEMS, a leaf spring, a mirror, a rotation shaft, and the like of micron sizes are formed by forming a thin film on a substrate and by partially separating the thin film from the substrate by performing an etching process. Accordingly, an MEMS structure has a three-dimensional structure and has a movable portion at least in a portion thereof.

As one of the fields for which the MEMS have attracted attention, there is a field of communication technology for configuring cellular phones or the like. In the cellular phones, many components such as a filter, an antenna switch, a transmitter and receiver switch, and the like other than an LSI are assembled. When utilization of multiple bands that use Bluetooth or wireless LAN is implemented, the number of inactive components such as an antenna shift switch and a band shift switch is increased. Thus, in order to implement miniaturization and power saving, it is a most effective countermeasure to decrease the number of components that are housed in one semiconductor chip. According to this countermeasure, there are additional advantages in that wiring is shortened, improvement of performance of MEMS components such as strength for noise and low loss can be acquired due to operation of the MEMS component performed in a mechanical manner. In addition, by using the semiconductor, integration of the MEMS components with typical existing constituent components such as integration of the MEMS components with an LSI by using semiconductors can be achieved. As an example of the above-described method of manufacturing the MEMS device, for example, there is technology disclosed in JPA-2008-114354.

As described above, the MEMS has various advantages. However, since the structure has a micro size, a deviation in the manufacturing process much affects the operating characteristics. In addition, in order to acquire high-performance operating characteristics that are uniform, various adjustment methods are necessary. For example, an MEMS resonator outputs signals having a predetermined frequency, and the frequency characteristics, for example, the operating frequency (resonance frequency), need to be within an allowed range that is regulated. As methods of adjusting the frequency characteristics, a method of increasing or decreasing the operating frequency by changing a driving voltage (DC bias voltage) (see S. Chowdhury, M. Ahmadi and W. C. Miller. "A Closed-Form Model for The Pull-in Voltage of Electrostatically Actuated Cantilever Beams", Journal of Micromechanics and Microengineering, 2005, pp. 756-763, vol. 15), a method of changing the physical properties or the size of the material by heating a movable portion which vibrates by allowing a current to flow through it (see JP T-A-2007-535275), a method of depositing a material in a movable portion (see Daphne Joachim, Liwei Lin, "Characterization of Selective Polysilicon Deposition for MEMS Resonator Tuning" Journal of Micromechanical Systems, April 2003, pp. 193-200, vol. 12, No. 2, IEEE), and the like have been proposed.

However, according to the above-described method of changing the operating frequency by changing the driving voltage, the range in which the operating frequency can be changed is limited. Accordingly, there are cases where adjustment cannot be performed. In addition, there is a problem that adjustable devices are limited to devices in which the operational aspects of a vibrator or the like depend on a driving voltage.

In addition, according to the above-described method using heating due to a current, since the method depends on the constituent material of a structure, there are cases where sufficient adjustment cannot be performed. In addition, there is also a problem in that the operational aspects may be changed such as a change in the vibration mode due to a partial change of the movable portion or the like.

In addition, according to the above-described method of depositing a material in the movable portion, the operational aspects may be changed, similarly to the above-described method, like a change in the vibration mode or the like by attaching a material in a part of the movable portion.

SUMMARY

An advantage of some aspects of the invention is that it provides a method of adjusting an MEMS device capable of adjusting the structural size of the MEMS structure over a broad range and performing size adjustment uniformly without changing the operational aspects and a method of manufacturing the MEMS device using the method of adjusting the MEMS device.

According to an aspect of the invention, there is provided a method of manufacturing an MEMS device. The method includes: forming a covering structure having an MEMS structure and a hollow portion, which is located on a periphery of the MEMS structure and is opened to an outside, on a substrate; and performing surface etching for the MEMS structure in a gas phase by supplying an etching gas to the periphery of the MEMS structure from the outside.

According to the above-described method, in the forming of covering structure on the substrate, the periphery of the MEMS structure is configured to be in the ventilation state through the hollow portion of the covering structure that is opened to the outside, and thereafter, surface etching is performed by supplying an etching gas to the periphery of the MEMS structure. Accordingly, the structural size of the MEMS structure can be adjusted over a broad range. In addition, since surface etching is performed in a gas phase, etching can be performed more uniformly even for an MEMS structure having a delicate and complicated structure. Accordingly, occurrence of adverse effects in the operation of the MEMS structure due to the etching can be avoided, and a variance in the operational aspects such as a change in the vibration mode due to a change in the partial structural size or the like can be prevented. In addition, since gas-phase etching is used, even when surface etching is performed for the MEMS structure disposed inside the hollow portion of the covering structure, deviation in the uniformity of the etching does not easily occur.

The above-described method may further include performing a test on operating characteristics of the MEMS structure and determining whether to perform in addition the surface etching by comparing a result of the test with a reference value, after the forming of the covering structure on the substrate. In such a case, the operating characteristics are tested, and whether to perform the surface etching further is determined by comparing the test result with the reference value. Then when surface etching is necessary, surface etching is additionally performed. On the other hand, when the etching process is not necessary, the next process is performed. Accordingly, an MEMS device having the operating characteristics within the range corresponding to the reference value can be manufactured in accordance with the structural size of the MEMS structure formed in the on-substrate structure forming process. In addition, the operating characteristic testing process may be formed before the performing of surface etching, after the performing of surface etching, or during the performing of surface etching as long as it is after the forming of the covering structure on the substrate. In addition, since the MEMS structure is disposed inside the hollow portion of the covering structure, it is difficult to check directly the etched state by external visual recognition. However, in this aspect, the operating characteristic testing process is included, and accordingly, there is an advantage in that the effect of the surface etching can be checked from the characteristic side.

In such a case it is preferable that the MEMS structure has a movable portion that can be operated, and, in performing a test on the operating characteristic, the test is performed in a state in which the movable portion is operated. In this case, since the operating characteristics of the MEMS structure are tested in the state in which the movable portion is operated, the operating characteristics of the MEMS structure having a movable portion can be tested accurately with high precision.

In the above-described method, it may be that the MEMS structure is configured by a silicon layer and the etching gas is $XeF_2$. In such a case, the MEMS structure is configured by a silicon layer, and accordingly, a device can be formed by using general semiconductor manufacturing technology. Therefore, reduction in the manufacturing costs, miniaturization of the device, improvement of the performance, and the like can be achieved. In addition, the above-described silicon layer includes a polycrystalline silicon layer, a single crystalline silicon layer, and an amorphous silicon layer, and also includes the above-described silicon layers in which various dopants such as the n-type and the p-type are doped at an arbitrary impurity density.

In addition, since the etching gas is $XeF_2$, the surface of the silicon layer can be etched in an easy manner. In addition, since etching of the silicon layer by using $XeF_2$ is isotropic etching, the exposed surfaces of the MEMS structure can be etched uniformly, whereby variance in the operational aspects can be reduced further. In addition, since the etching rate of $XeF_2$ for a silicon oxide film, a silicon nitride film, and aluminum is extremely low, there is no problem with etching the above-described materials that are used in an etching stopping layer, a wiring layer, and an electrode layer corresponding to the sacrifice layer, the interlayer insulating film, and release etching in the semiconductor manufacturing technology. Accordingly, the process can be designed without considering adverse effects due to surface etching, and time for surface etching and other conditions can be set over a broad range.

The type of etching gas according to this aspect is not limited to $XeF_2$ described above, and the following various gases can be used. For example, as the etching gas for the silicon layer other than $XeF_2$, $Cl_2$, a mixed gas of $Cl_2$ and HBr, a mixed gas of $Cl_2$ and $O_2$, a mixed gas of $CF_4$ and $O_2$, $SF_6$, a mixed gas of $Cl_2$ and $N_2$, a mixed gas of $Cl_2$ and HCl, a mixed gas of HBr, $Cl_2$, and $SF_6$, $C_4F_8$, $CBrF_3$, a mixed gas of $SiCl_4$ and $Cl_2$, and a mixed gas of $SF_6$, $N_2$, and Ar, a mixed gas of $BCl_2$, $Cl_2$, and Ar, or the like can be used.

In addition, as the etching gas for silicon nitride ($Si_3N_4$), $CF_4$, a mixed gas of $CF_4$ and $O_2$, a mixed gas of $CF_4$ and $H_2$, a mixed gas of $CHF_3$ and $O_2$, $C_2F_6$, a mixed gas of $CHF_3$, $O_2$, and $CO_2$, a mixed gas of $CH_2F_2$ and $CF_4$, or the like can be used.

In addition, as the etching gas for silicon oxide ($SiO_2$), $CF_4$, a mixed gas of $C_4F_8$, $O_2$, and Ar, a mixed gas of $C_5F_8$, $O_2$, and Ar, a mixed gas of $C_3F_6$, $O_2$, and Ar, a mixed gas of $C_4F_8$ and CO, a mixed gas of $CHF_3$ and $O_2$, a mixed gas of $CF_4$ and $H_2$, or the like can be used.

In addition, as the etching gas for aluminum (Al), a mixed gas of $BCl_3$ and $Cl_2$, a mixed gas of $BCl_3$, $CHF_3$, and $Cl_2$, a mixed gas of $BCl_3$, $CH_2$ and $Cl_2$, a mixed gas of B, $Br_3$, and $Cl_2$, a mixed gas of $BCl_3$, $Cl_2$, and $N_2$, a mixed gas of $SiO_4$ and $Cl_2$, or the like can be used.

In addition, as the etching gas for copper (Cu), $Cl_2$, a mixed gas of $SiCl_4$, $Cl_2$, $N_2$, and $NH_3$, a mixed gas of $SiCl_4$, Ar, and $N_2$, a mixed gas of $BCl_3$, $SiCl_4$, $N_2$, and Ar, a mixed gas of $BCl_3$, $N_2$, and Ar or the like can be used.

In addition, as the etching gas for an organic material (photoresist, polyimide resin, or the like), $O_2$ plasma can be used in a case where plasma etching is used.

In the above-described method, it may be configured that the performing of a test on the operating characteristic is performed in parallel with the surface etching during the performing of surface etching, and the surface etching is stopped when the operating characteristics correspond to a range corresponding to the reference value. In such a case, since the structure etching process is performed by using gas-phase etching, the operating characteristics can be tested in real time as described above. In addition, in such a case, since the operating characteristics are tested and then, the surface etching is stopped when the operating characteristics correspond to the above-described range, the operating characteristics can be adjusted more accurately. In addition, in the case where the MEMS structure has the movable portion, the etching gas is agitated by operating the movable portion during the gas-phase etching. Accordingly, there are additional advantages in that the uniformity of the surface etching for the movable portion is improved further, and the etching rates of narrow little portions (portions facing each other with a narrow gap interposed therebetween) are increased further. In particular, according to this aspect, since the MEMS structure is disposed inside the hollow portion of the covering structure, it is difficult to check directly the degree of the surface etching from the outside by visual recognition or the like. However, by performing testing of the operating characteristics in real time during the surface etching, the etching state can be controlled accurately, which is a notable advantage.

In the above-described method, it may be configured that the MEMS device is an MEMS resonator that vibrates the movable portion of the MEMS structure, and the operating characteristics are frequency characteristics. Accordingly, in the operating characteristic testing process, the frequency characteristics are detected by vibrating the movable portion. However, when the test is performed during the performing of surface etching, by vibrating the movable portion, there is an advantage in that the agitation action for the etching gas can be improved further, in addition to the above-described advantages.

In such a case, it is preferable that the performing of a test on operating characteristic is performed in parallel with the performing of surface etching during the performing of structure etching by vibrating the movable portion all the time, and the surface etching is stopped when the operating characteristics correspond to the range corresponding to the reference value. In such a case, the performing of surface etching being performed by using gas-phase etching, the operating characteristics can be tested in real time. In addition, in this case, the operating characteristics are tested, and then, the surface etching is stopped when the operating characteristics correspond to the above-described range, and accordingly, the operating characteristics can be adjusted more accurately. In addition, in the case where the MEMS structure has the movable portion, the etching gas is agitated by operating the movable portion during the gas-phase etching. Accordingly, there are additional advantages in that the uniformity of the surface etching for the movable portion is improved further, and the etching rates of narrow little portions (portions facing each other with a narrow gap interposed therebetween) are increased further. In addition, while the surface etching is performed, the movable portion is vibrated all the time. Accordingly, the stability of the etching rate over time or the reproducibility of the etching rate is improved further.

The above-described method may further include: closing the opening of the lid body after the performing of surface etching. In this case, the forming of a covering structure includes: forming the MEMS structure together with a first sacrifice layer on the substrate; forming a second sacrifice layer that configures at least a part of the covering structure on the upper side of the MEMS structure; forming a lid body that has an opening on the second sacrifice layer; and eliminating the first sacrifice layer and the second sacrifice layer through the opening of the lid body, releasing the MEMS structure, and forming the hollow portion on the periphery of the MEMS structure. In addition, the performing of surface etching is performed by introducing the etching gas into an inside of the hollow portion through the opening of the lid body. In such a case, by introducing the etching gas into the inside of the hollow portion through the opening of the lid body, the performing of surface etching can be performed without any problem. In addition, by closing the opening of the lid portion in the opening/closing process, the hollow portion in which the MEMS structure is housed can be sealed. Accordingly, in a case where a manufacturing process in which a plurality of chips is processed in units of one wafer and then the chips are divided is employed as in a general semiconductor manufacturing process, the sealing of the MEMS structure can be performed in units of one wafer. Therefore, a sealing operation performed in units of one chip can be omitted.

According to a method of adjusting an MEMS device and a method of manufacturing an MEMS device by using the adjusting method, there are excellent advantages in that the structural size of the MEMS structure can be adjusted over a broad range, uniform size adjustment can be performed, and a variance in the operational aspects can be avoided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Next, exemplary embodiments of the invention will be described with reference to the accompanying drawings. First, a method of manufacturing an MEMS device according to an embodiment of the invention will be described with reference to FIGS. 1A to 1C and FIGS. 2A and 2B. FIGS. 1A to 1C and FIGS. 2A and 2B are schematic cross-sectional views showing each process of the method of manufacturing the MEMS device according to this embodiment.

Figure 1A:
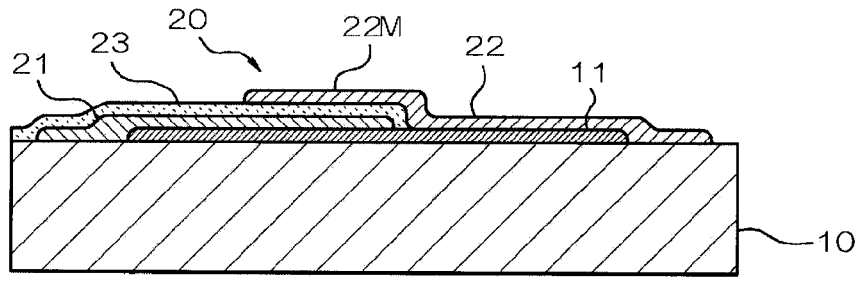
FIGS. 1A to 1C are schematic cross-sectional views showing a method of manufacturing an MEMS device according to an embodiment of the invention.

As shown in FIG. 1A, in this embodiment, an MEMS device is manufactured which is configured by using a substrate (wafer) 10 formed of a semiconductor such as a single crystalline silicon as a base body and forming an MEMS structure 20 on the substrate 10. However, the substrate 10 is not limited to semiconductor and may be formed from various materials such as glass, ceramics, or resin.

On the surface of the substrate 10, an insulating film (not shown) made from silicon oxide or the like is formed as is necessary, and accordingly, insulation from the substrate 10 is acquired. However, when the substrate 10 is originally made from a material having a high insulation property such as glass, ceramics, resin, or lowly-doped semiconductor, or when a substrate (for example, an SOI substrate or the like) having a surface on which an insulating film is formed is used, such an insulating film is not necessary.

In addition, on the surface of the substrate 10, a bottom layer 11 having resistance for an etching process such as a release etching process or a surface etching process, to be described later, is formed. When semiconductor manufacturing technology using a general silicon base is used, the bottom layer 11 is configured by a silicon nitride film that is formed by using a CVD method or the like. It is preferable that the bottom layer 11 is formed to be limited in a range that is necessary for the etching process.

In addition, on the substrate 10, a lower layer pattern 21 that can serve as a fixed electrode and a wiring portion thereof and an upper layer pattern 22 that can serve as a movable electrode and a wiring portion thereof are formed through a first sacrifice layer 23. The lower layer pattern 21 is configured as a portion of a first conductive layer that is deposited on the bottom layer 11. In addition, the upper layer pattern 22 is configured such that a second conductive layer faces the portion of the first conductive layer through the first sacrifice layer 23 and is conductively connected to the other portion of the first conductive layer by depositing the second conductive layer on the other portion of the first conductive layer, which is arranged to be separated from the portion of the first conductive layer constituting the lower layer pattern 21, and both an area located on the first sacrifice layer 23 formed on the portion of the first conductive layer and an area located on the other portion of the first conductive layer in which the first sacrifice layer 23 is not formed. The above-described processes correspond to a step for forming the MEMS structure 20.

In the MEMS structure 20 of the example shown in the figure, a portion of the upper layer pattern 22 has a movable portion 22M that faces the lower layer pattern 21 through the first sacrifice layer 23. Although being fixed on the substrate 10 in the state shown in FIG. 1A, the movable portion 22M is finally in an operable state through a process to be described later. As a material configuring the conductive layer (the first conductive layer and the second conductive layer), silicon having conductivity is preferably used. For example, the conductive layer may be made of a polycrystalline silicon or amorphous silicon in which an n-type dopant such as phosphorus is introduced as an impurity. The dopant is not limited to the n-type dopant, and a p-type dopant such as boron may be used. Such materials can be deposited in an easy manner by using a CVD method, a sputtering method, or the like. However, as the above-described material, any conductive body having a conductivity level necessary for the operation of the MEMS structure 20 may be used. For example, metal such as aluminum may be used as the material.

Figure 1B:
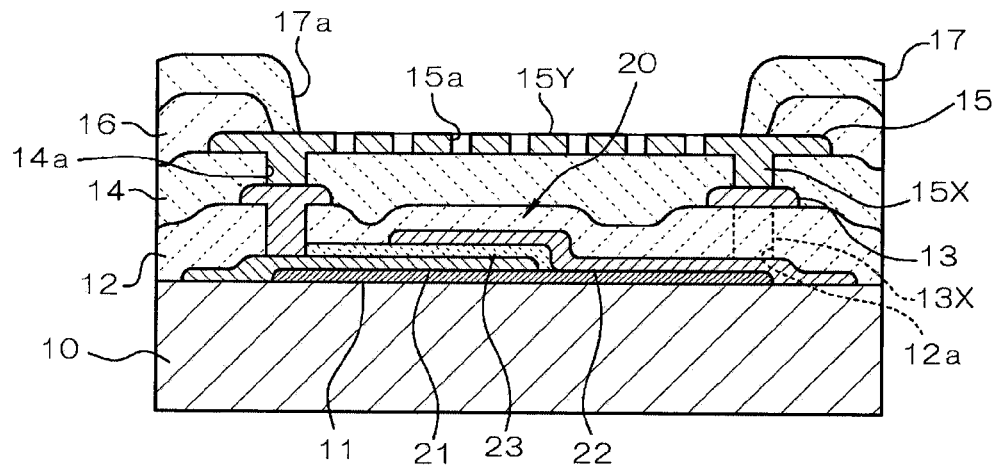

As shown in FIG. 1B, an interlayer insulating film 12 made of silicon oxide or the like is formed on the MEMS structure 20, and an opening 12a is formed in a portion of the interlayer insulating film 12. A wiring layer 13 configured by a conductive body such as aluminum is formed on the interlayer insulating film 12. The wiring layer 13 is conductively connected to lower-layer conductive bodies such as the lower layer pattern 21, the upper layer pattern 22, and other lower layer wirings through the opening 12a. At this point, a portion of the wiring layer 13 configures a surrounding wall 13X that is formed so as to wind around the periphery of the MEMS structure 20. In addition, the opening 12a serves as a contact hole for a wiring connection or a shape frame for configuring the surrounding wall 13X.

Similarly, an interlayer insulating film 14 made of silicon oxide or the like is formed on the wiring layer 13, and an opening 14a is also formed in the interlayer insulating film 14. A wiring layer 15 configured by a conductive body such as aluminum is formed on the interlayer insulating film 14, and the wiring layer 15 is conductively connected to lower-layer conductive bodies such as the wiring layer 13, the surrounding wall 13X, and other wiring patterns through the opening 14a. At this moment, a portion of the wiring layer 15 configures a surrounding wall 15X that is formed so as to wind around the periphery of the MEMS structure 20. In addition, the opening 14a serves as a contact hole for a wiring connection or a shape frame for configuring the surrounding wall 15X. Here, portions of the interlayer insulating films 12 and 14 that are located on the MEMS structure 20, that is, portions interposed between the MEMS structure 20 and a lid body 15Y to be described later become a second sacrifice layer. The step for forming the interlayer insulating films 12 and 14 is a step for forming the second sacrifice layer.

The other portion of the wiring layer 15 configures the lid body 15Y that covers the upper side of the MEMS structure 20. One or a plurality of openings 15a is disposed in the lid body 15Y. In addition, the lid body 15Y is formed on the interlayer insulting film 14. This step is a step for forming the lid body.

The stack structure that is formed by alternately stacking the interlayer insulating films 12 and 14 and the wiring layers 13 and 15 on the substrate 10 corresponds to the above-described covering structure. However, the covering structure is not limited to such a stack structure, and for example, may be formed only by an insulating layer corresponding to the second sacrifice layer. In addition, the above-described stack structure is configured as a four-layer structure including two cycles in the example shown in the figure. However, the number of cycles or the number of stacks of the stack structure is arbitrary. Thus, for example, the number of the cycles may be one or three or more. The number of the cycles or the number of the stacks is appropriately determined based on the wiring structure or the circuit structure of the substrate 10.

On the wiring layer 15, an insulating film 16 is formed additionally. This insulating film 16 may form the surface of a finally-manufactured device. The insulation film 16 is preferably made of silicon dioxide, silicon nitride, or the like. Furthermore, it is more preferable that the insulating film 16 is formed as a structure of two layers of the silicon oxide and silicon nitride. In such a case, the silicon oxide layer is formed on the lower layer side (the wiring layer 15 side) and the silicon nitride layer is formed thereon (on the surface thereof). In addition, when implementation of an electric connection on the surface of the device is necessary, an opening not shown in the figure is formed in the insulating film 16, and a contact point that is conductively connected to the wiring layer 15 is formed through the opening.

Next, as is necessary, a protection film 17 having an opening 17a on the upper side of the MEMS structure 20 is formed on the surface of the above-described structure. The protection film 17 is not particularly limited. For example, a resist mask that is formed by coating the surface with a photosensitive resist and exposing and developing the photosensitive resist so as to form the opening 17a may be used. This protection film 17 has a function for protecting a portion that is not required to be etched in a release process to be described later. However, when the function of the protection film 17 is exhibited by the insulating film 16, the protection film 17 is not necessary.

Figure 1C:
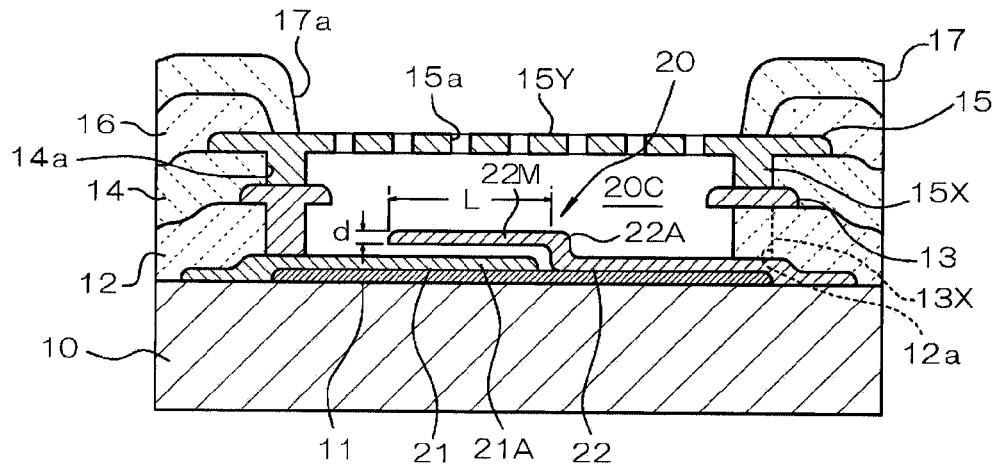

Next, as shown in FIG. 1C, the first sacrifice layer and the second sacrifice layer described above are eliminated through the opening 15a of the lid body 15Y by using an etching solution such as hydrofluoric acid or buffering hydrofluoric acid. This is a step (release step) for forming a hollow portion on the periphery of the MEMS structure together with releasing the MEMS structure. By performing this step, the movable portion 22M of the MEMS structure 20 is released from the first sacrifice layer and the second sacrifice layer so as to be in an operable state, and the periphery of the MEMS structure 20 in the ventilation state with the outside through the opening 15a of the lid body 15Y. In other words, on the lower side of the lid body 15Y, a hollow portion 20C is formed. Inside the hollow portion 20C, the MEMS structure is housed, and accordingly, the hollow portion 20C communicates with the outside through the opening 15a. As described above, a process that includes each step described above and is for configuring the periphery of the MEMS structure 20 so as to be in a ventilation state with the outside is the forming of a covering structure on the substrate. In addition, in the release step, it is preferable that the etching solution is sufficiently removed by cleaning the inside of the hollow portion 20C by water washing or the like.

In the MEMS structure 20 configured as above, the movable portion 22M of the movable electrode 22A that is disposed in the upper layer pattern 22 is disposed to face the fixed electrode 21A disposed in the lower layer pattern 21 through a gap. Accordingly, by applying an AC signal between the fixed electrode 21A and the movable electrode 22A, the movable portion 22M vibrates so as to increase or decrease the gap due to an electrostatic force. The movable portion 22M has a resonance frequency as given below that is determined based on the length L and the depth d thereof, and the MEMS structure 20 serves as a resonator or a signal filter.

The resonance frequency Fr of the MEMS structure 20 can be represented as the following Equation (1).

$$Fr = \frac{1}{2\pi}\sqrt{\frac{Km}{Me}} \quad (1)$$

Here, Km denotes the mechanical rigidity of the movable portion 22M, and Me denotes the effective mass of the movable portion 22M. The mechanical rigidity Km and the effective mass Me are highly influenced by the length, the width, and the depth of the movable portion 22M. In FIG. 1C, the length L and the depth d of the movable portion 22M are shown.

Figure 3:
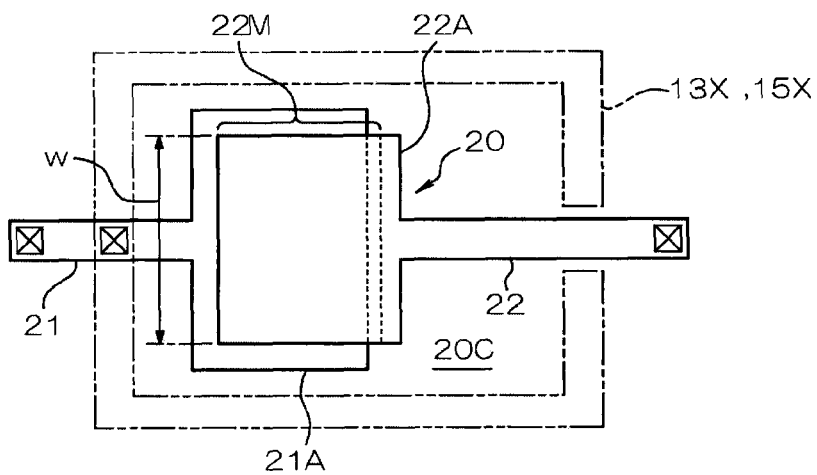
FIG. 3 is a plan view of an MEMS structure according to an embodiment of the invention.

FIG. 3 is a plan view of the MEMS structure 20. In the MEMS structure 20 configured as described above, the movable electrode 22A is disposed to overlap with the fixed electrode 21A on the plan view on the upper side of the fixed electrode 21A, and the movable portion 22M is configured to be movable on the fixed electrode 21A. In the example shown in the figure, the width of the fixed electrode 21A is configured to be greater than the width w of the movable portion 22M, and the entire movable portion 22M in the widthwise direction is disposed on the fixed electrode 21A.

In the example shown in the figure, the fixed electrode 21A, through a wiring that is configured in a portion of the lower layer pattern 21 as denoted by dotted lines in FIG. 1C, is conductively connected to a wiring pattern that is formed on a portion of the wiring layer 13 through the contact hole of the interlayer insulating film 12. In addition, the movable electrode 22A, through a wiring configured in a portion of the upper layer pattern 22, as denoted by dotted lines shown in FIG. 1C, is conductively connected to a wiring pattern configured in another portion of the wiring layer 13 through another contact hole of the interlayer insulation film 12. In addition, the fixed electrode 21A is also conductively connected to the surrounding walls 13X and 15X, and the surrounding walls 13X and 15X are configured so as to surround the MEMS structure 20 as shown in FIG. 3. However, the surrounding walls 13X and 15X have a structure in which a portion is void so as not to be brought into conductive contact with the wiring of the upper layer pattern 22 that is connected to the movable electrode 22A.

In addition, the wiring structure of the MEMS structure 20 is not limited to the above-described configuration, and may be configured so as to supply a predetermined signal between the fixed electrode 21A and the movable electrode 22A. For example, a wiring connected to at least one of the fixed electrode 21A and the movable electrode 22A may be conductively connected to the outside through a conductive area formed in the surface layer portion of the substrate 10. In such a case, the surrounding walls 13X and 15X may be configured so as to surround completely the MEMS structure 20 on the plan view. Alternatively, the wiring connected to at least one of the fixed electrode 21A and the movable electrode 22A may be configured to be conductively connected to the outside through the wiring pattern configured in a portion of the wiring layer 15.

Figure 2A:
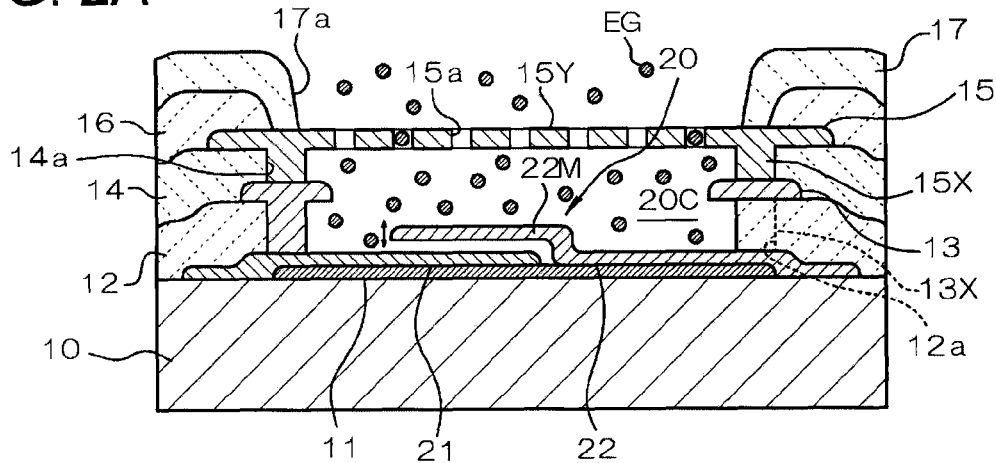
FIGS. 2A to 2B are schematic cross-sectional views showing a method of manufacturing an MEMS device according to an embodiment of the invention.
Figure 2B:
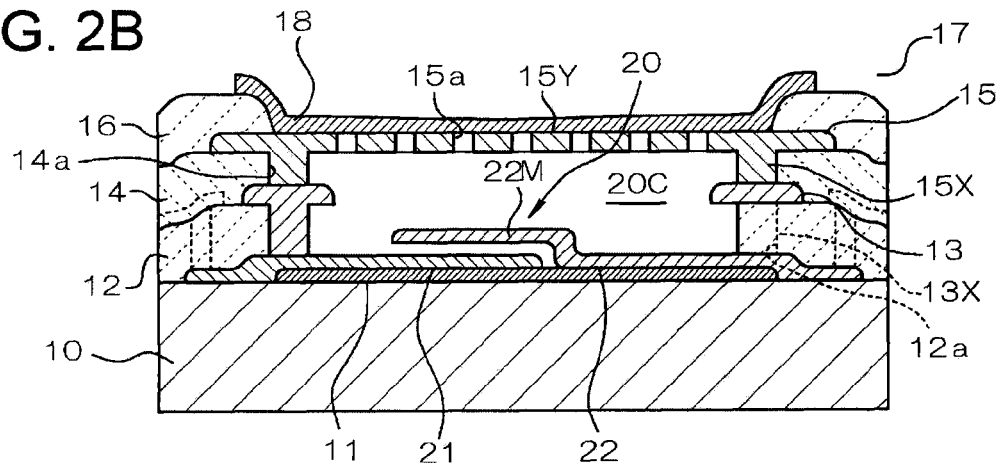

Next, as shown in FIG. 2A, etching gas EG is introduced from the outside into the hollow portion 20C through the opening 15a, and etching for the surface of the MEMS structure 20 is performed in a gas phase. At this point, in order to introduce the etching gas EG smoothly and efficiently, it is preferable that the etching gas EG is supplied after decompressing (vacuuming) the inside of the hollow portion 20C, as will be described later.

As the etching gas EG, in this embodiment, xenon difluoride ($XeF_2$) is used. In addition, inert gas such as $N_2$ or Ar or any other active gas may be mixed into the above-described etching gas. Xenon difluoride, as shown in Chemical Equation (1), is decomposed into Xe and F on a silicon surface, and F reacts with silicon so as to generate volatile SiFx.

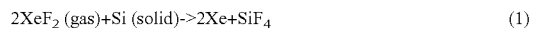

$$2XeF_2\ (gas) + Si\ (solid) \rightarrow 2Xe + SiF_4 \quad (1)$$

Accordingly, silicon is etched. The etching characteristic for silicon is isotropic, and thus the surface of the MEMS structure 20 can be etched uniformly. In contrast, xenon difluoride scarcely has the etching capability for silicon oxide, silicon nitride, and aluminum. As a result, in this embodiment, the inner wall face of the hollow portion 20C, the bottom face, the lid body, and the like that are disposed on the periphery of the MEMS structure 20 are scarcely influenced. However, in a case where there is moisture, the moisture may react with F so as to generate HF, thereby affecting silicon oxide. Accordingly, it is preferable that moisture is sufficiently eliminated, particularly, from the inner face of the hollow portion 20C.

As described above, a process for etching the surface of the MEMS structure 20 in a gas phase is the above-described structure etching process. In the structure etching process, the periphery, that is, the surface, of the MEMS structure 20 that is exposed to the hollow portion 20C is etched by the etching gas EG. In such a case, by performing the etching process in the gas phase, the faces of the fixed electrode 21A and the movable portion 22M facing each other that are narrow little portions can be sufficiently etched as well. In addition, both the front and rear faces of the movable portion 22M are exposed, and the length L or the width w are sufficiently greater than the depth d. Accordingly, mainly the depth d of the movable portion 22M relatively decreases much, whereby the resonance frequency Fr of the MEMS structure 20 decreases. Therefore, by performing the structure etching process, the operating characteristics, that is, the frequency characteristics of the MEMS structure 20 can be adjusted. In this embodiment, the resonance frequency Fr of the MEMS structure 20 is adjusted to be within an allowed frequency range having a reference value as its center by performing the structure etching process.

The structure etching process can be performed while the MEMS structure 20 operates by applying an AC voltage between the fixed electrode 21A and the movable electrode 22A. When the MEMS structure 20 operates, in this embodiment, the movable portion 22M vibrates vertically. As described above, by vibrating the movable portion 20M, the etching gas EG is agitated inside the hollow portion 20C. Accordingly, the etching efficiency (etching rate) can be increased, and the uniformity of the surface etching can be improved. In particular, the amount of etching for the movable portion 22M vibrating in the etching gas EG can be increased, and the uniformity of the etching process for the movable portion 22M can be achieved.

In addition, the above-described advantages are not limited to a case where the MEMS structure 20 configures an MEMS resonator as in this embodiment. Thus, in a case where a movable portion is arranged in various types of MEMS devices, to be described later, the same advantages, although in different degrees, can be acquired by performing the etching process while the movable portion is moved (parallel movement, rotation, flexural deformation, or opened or closed).

The operation of the above-described MEMS structure 20 may be performed only in a part of the period of the structure etching process or may be performed over the entire period of the structure etching process. In the latter case, there are advantages that the etching characteristics (the etching rate or the etching uniformity) can be maintained to be constant over time, reproducibility is improved, and additional improvement of the etching characteristics (the etching rate or the etching uniformity) can be achieved, during the structure etching process.

As described above, by operating the MEMS structure 20, the operating characteristics of the MEMS structure 20 can be detected. In this embodiment, by vibrating the movable portion 22M, the frequency characteristics of the MEMS structure 20, for example, the resonance frequency Fr can be measured. This process is the performing of a test on operating characteristic. This operating characteristic testing process is a process for testing the operating characteristics of the MEMS structure 20. However, the testing of the operating characteristics is not limited to a case where the testing is performed by actually operating the movable portion of this embodiment. Thus, the testing of the operating characteristics includes a case where the structural size of the MEMS structure 20 is statically tested by a unit (for example, measurement of static capacitance, an optical measurement method, or the like), a case where the rigidity, the strength, or the like of the MEMS structure 20 is mechanically tested (for example, the MEMS structure is tested by using a probe or the like), a case where the testing is performed by operating the MEMS structure 20 in a manner different from the normal operation (for example, the MEMS structure is vibrated in a different vibration mode), a case where the testing is performed by operating the movable portion by applying vibration accelerated externally, or the like.

In this embodiment, the operating characteristic testing process may be performed during a part of the period of the structure etching process or the entire period of the structure etching process. In the former case, the testing of the operating characteristics may be performed once or several times during any arbitrary partial period. On the other hand, in the latter case, the testing of the operating characteristics may be performed at a predetermined test cycle or in real time.

This operating characteristic testing process may be performed not in the structure etching process but at a time when the structure etching process is temporally stopped or after the structure etching process. In such a case, it may be configured that the operating characteristic testing process is performed after the structure etching process is performed at a predetermined time, and the structure etching process is performed again or a next process is performed in accordance with the acquired result of the testing. Such a determination, usually, is performed by comparing the result of the testing with a reference value and determining to perform the next process in a case where the result is within a predetermined allowed range and to perform the structure etching process again in a case where the result is not within the predetermined allowed range.

In addition, the operating characteristic testing process may be performed before the structure etching process when it is after the on-substrate structure forming process. By performing the operating characteristic testing process before the structure etching process, a surface etching time or the amount of etching gas for the structure etching process to be performed later can be set.

When the process for adjusting the MEMS structure 20 is completed as described above, finally, the opening 15a of the lid body 15Y is closed. In this process, for example, the opening 15a is closed by forming a sealing layer 18 on the lid body 15Y. The sealing layer is preferably deposited by using a gas-phase growth method such as a CVD method, a deposition method, or a sputtering method in a decompressed state. By using the gas-phase growth method performed in the decompressed state, the opening 15a is closed, whereby the hollow portion 20C can be in a decompressed state (vacuumed state) simultaneously with closing the opening 15a. In addition, in this embodiment, the sealing layer 18 may be configured by one of metal such as aluminum and an insulating body made of silicon oxide, silicon nitride, or the like. Alternatively, the opening 15a can be closed by coating the lid body 15Y with organic resin or the like.

Figure 4:
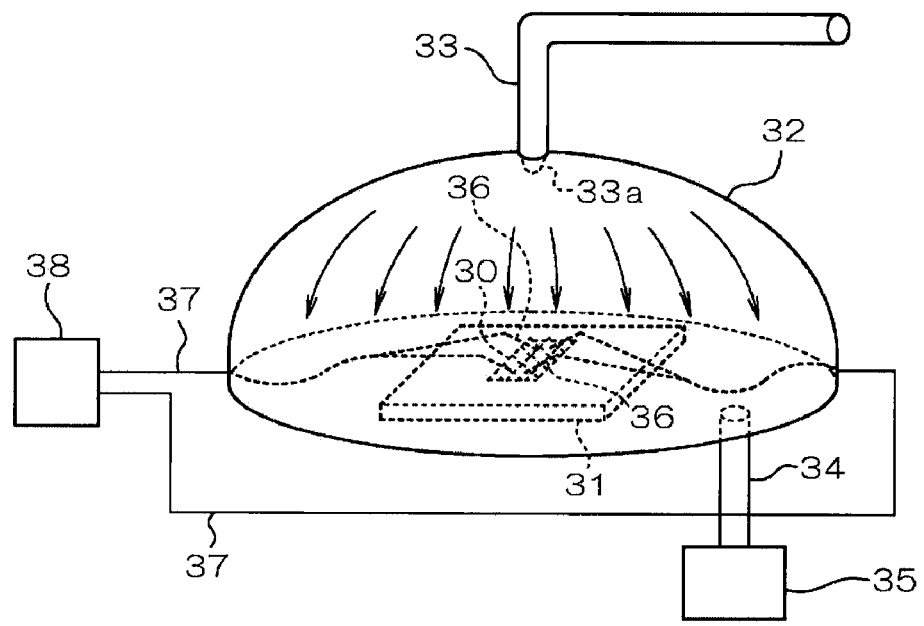
FIG. 4 is a schematic perspective view illustrating the appearance of an example of a structure etching process according to an embodiment of the invention.

Next, a method of performing the operating characteristic testing process in the method of manufacturing the MEMS device according to this embodiment will be described in detail with reference to FIGS. 4 to 7. FIG. 4 is a schematic perspective view showing a process apparatus for performing the structure etching process for one or a plurality of MEMS chips 30 of the MEMS device shown in FIG. 1C manufactured as described above.

The MEMS chip 30 is disposed on a test jig 31, and the test jig 31 is housed in a chamber 32. The chamber 32 is configured so as to be supplied with the etching gas EG through a gas supply tube 33. In addition, an exhaust tube 34 is connected to the chamber 32, and the exhaust tube 34 is connected to an exhaust device 35. With electrode terminals, not shown in the figure, of the MEMS chip 30 on the test jig 31, a plurality of probes 36 is brought into conductive contact. These probes 36 are connected to a test device 38 through wirings 37.

Initially, the inside of the chamber 32 is decompressed by the exhaust device 35. Thereafter, by supplying the etching gas EG from a nozzle 33a through the gas supply tube 33, the etching gas EG is introduced into the inside of the hollow portion 20C shown in FIG. 1C, and the structure etching process is performed. Accordingly, the etching gas EG can be introduced into the inside of the hollow portion 20C in a short time with a feed composition maintained. As a result, the surface etching for the MEMS structure 20 can be started immediately. In addition, after starting the structure etching process, in order to increase circulation of the etching gas EG inside and outside the hollow portion 20C, the structure etching process can be performed intermittently by alternately repeating the decompression process performed by the exhaust device 35 and the gas introduction process for the etching gas EG. In addition, when the structure etching process is stopped or is completed, the surface etching for the MEMS structure 20 can be immediately stopped by performing decompression by using the exhaust device 35. In such a case, when the surface etching is stopped in accordance with an elapse of time or the result of the real-time test, the deviation in the accuracy of the amount of the surface etching can be decreased. Alternatively, the surface etching may be performed by performing exhaustion by using the exhaust device 35 while supplying the etching gas EG and maintaining the inside of the chamber 32 at a predetermined pressure.

Since the probes 36 are brought into conductive contact with electrode terminals of the MEMS chip 30 inside the chamber 32 all the time, the operating characteristic testing process can be performed by the test device 38 during the structure etching process or at any arbitrary time after the structure etching process.

Figure 9:
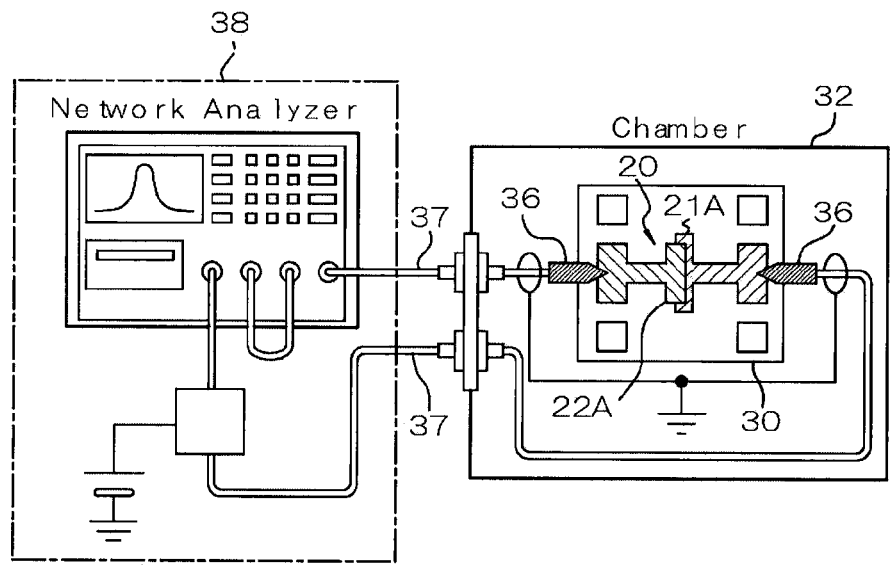
FIG. 9 is a schematic diagram showing the appearance of an example of an operating characteristic testing process according to an embodiment of the invention.

FIG. 9 shows an example of the configuration of the test device 38. The fixed electrode 21A and movable electrode 22A of the MEMS structure 20 inside the chamber 32 are connected to the test device 38 through the probe 36 and the wiring 37. The main body of the test device 38 is configured as a network analyzer, and the frequency characteristics of the MEMS structure 20 are measured by using the network analyzer. By using the test device 38, the frequency characteristics (resonance frequency) of the MEMS structure 20 can be detected at any arbitrary timing or in real time.

Figure 5:
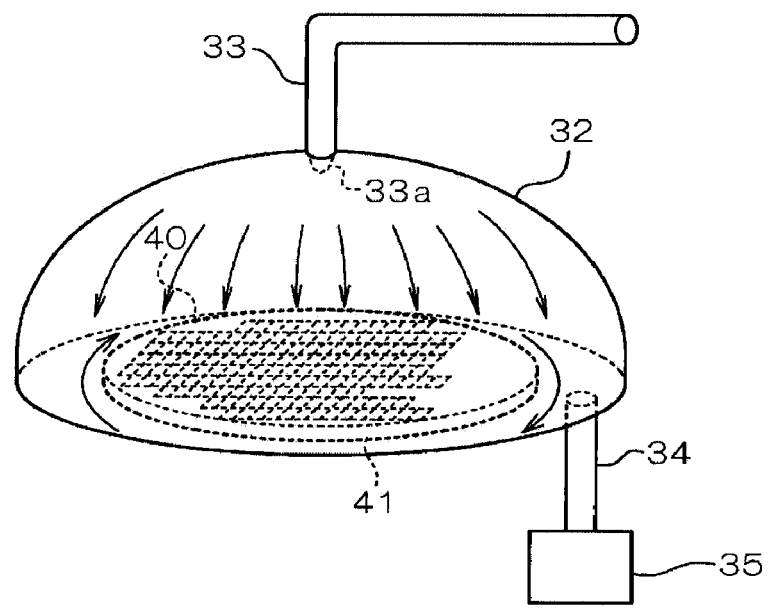
FIG. 5 is a schematic perspective view illustrating the appearance of another example of a structure etching process according to an embodiment of the invention.

FIG. 5 is a schematic perspective view showing a process apparatus for performing the structure etching process for an MEMS wafer 40 that is formed by arranging a plurality of structures shown in FIG. 1C. This process apparatus basically includes a gas supply tube 33, a nozzle 33a, an exhaust tube 34, and an exhaust device 35 that are the same as those of the process apparatus shown in FIG. 4. Thus, these configurations and the processes using the configurations will be omitted here.

In this process apparatus, the MEMS wafer 40 is disposed inside a chamber 32 in a state being disposed on a support base 41. Also in this apparatus, similarly to the above-described process apparatus, initially, the inside of the chamber 32 is decompressed by the exhaust device 35. Thereafter, by supplying etching gas EG from the nozzle 33a through the gas supply tube 33, the etching gas EG is introduced into the inside of a hollow portion 20C shown in FIG. 1C, and the structure etching process is performed. At this moment, similarly to the above-described process apparatus, in order to increase circulation of the etching gas EG inside and outside the hollow portion 20C, the structure etching process can be performed intermittently by alternately repeating the decompression process performed by the exhaust device 35 and the gas introduction process for the etching gas EG or the surface etching can be performed by introducing the etching gas EG while performing exhaustion.

According to this apparatus, since the MEMS wafer 40 in which areas to be a plurality of MEMS chips 30 are arranged is processed simultaneously, processing efficiency can be increased. Here, by rotating the support base 41, uniformity of reaction of the etching gas EG that is supplied through the gas supply tube 33 can be improved. In addition, in order to adjust distribution of the supply amount of the etching gas EG on the surface of the MEMS wafer 40 that is supplied through the gas supply tube 33, it is preferable that the number of rotations of the support base 41 or the shape of the nozzle 33a is appropriately adjusted.

Figure 6:
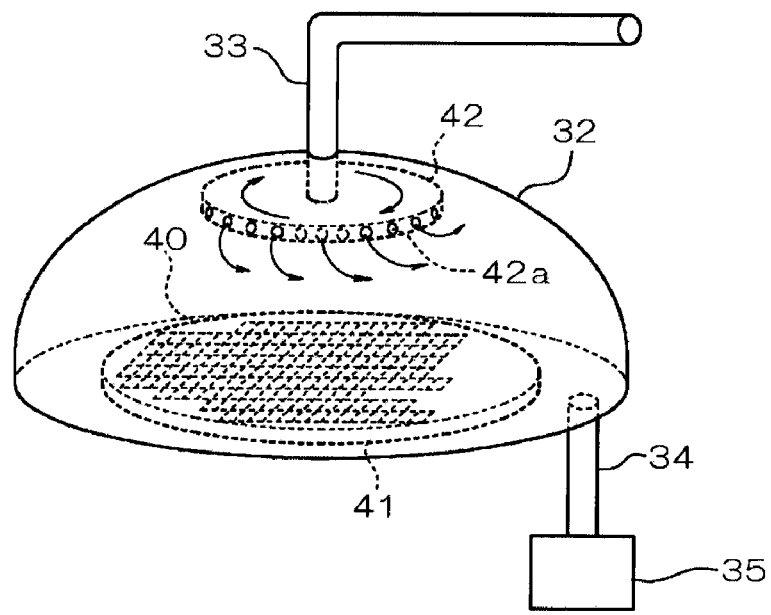
FIG. 6 is a schematic perspective view illustrating the appearance of another example of a structure etching process according to an embodiment of the invention.

FIG. 6 shows a case where the MEMS wafer 40 is processed, similarly to FIG. 5. In this apparatus, a gas ejecting head 42 disposed in the upper portion inside the chamber 32 is connected to the gas supply tube 33, and a plurality of nozzles 42a is arranged to be formed along the outer periphery of the gas ejecting head 42. Accordingly, the etching gas EG can be uniformly supplied over a broader range by using the plurality of nozzles 42a. In addition, in this apparatus, the gas ejecting head 42 rotates about an axis line of the chamber 32, and accordingly, a more uniform gas supplying state can be acquired. In addition, the above-described configuration of FIG. 6 can be applied to the apparatus shown in FIG. 5.

Figure 7:
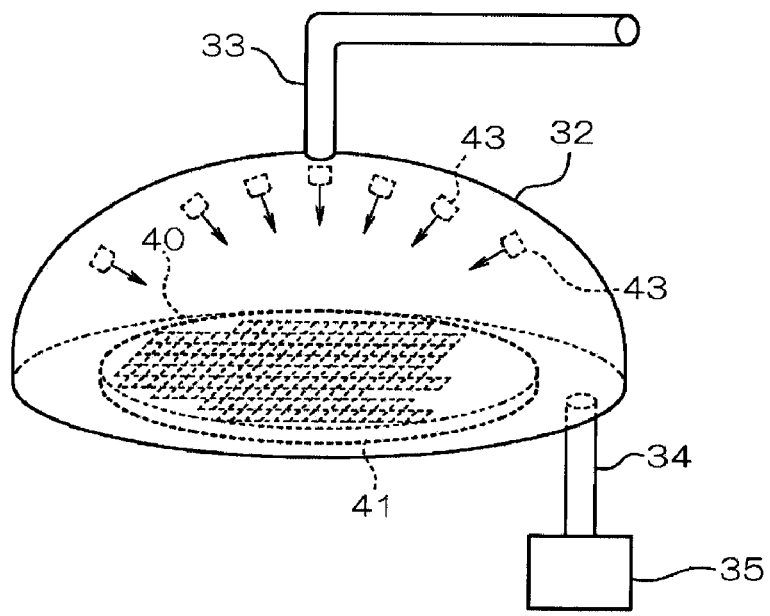
FIG. 7 is a schematic perspective view illustrating the appearance of still another example of a structure etching process according to an embodiment of the invention.

FIG. 7 shows a case where the MEMS wafer 40 is simultaneously processed as in FIG. 5. However, in this apparatus, a plurality of nozzles 43 that is disposed in the upper portion of the inside of the chamber 32 and can adjust the gas ejecting amounts is connected to the gas supply tube 33. In addition, by ejecting the etching gas EG from the plurality of nozzles 43, the ejecting gas EG can be supplied to the MEMS wafer 40, which is located on the support base 41, with an appropriate distribution of the flow amounts. In this apparatus, the amounts of etching (the etching rates) of the surface in the structure etching process can be controlled in accordance with the distribution of the operating characteristics of the MEMS structures 20 formed in areas to be a plurality of MEMS chips arranged within the MEMS wafer 40. In other words, in a case where the operating characteristics (for example, the resonance frequency) of the MEMS structures 20 within the MEMS wafer 40 have a distribution denoted by a solid line in a graph shown in FIG. 11, the amounts of the etching gas EG ejected from the plurality of nozzles are adjusted so as to acquire uniform operating characteristics as denoted by a dotted line by reducing the deviation of the distribution. Alternatively, for the same purpose, the positional distribution of the plurality of nozzles 43 inside the chamber 32 may be adjusted.

Figure 11:
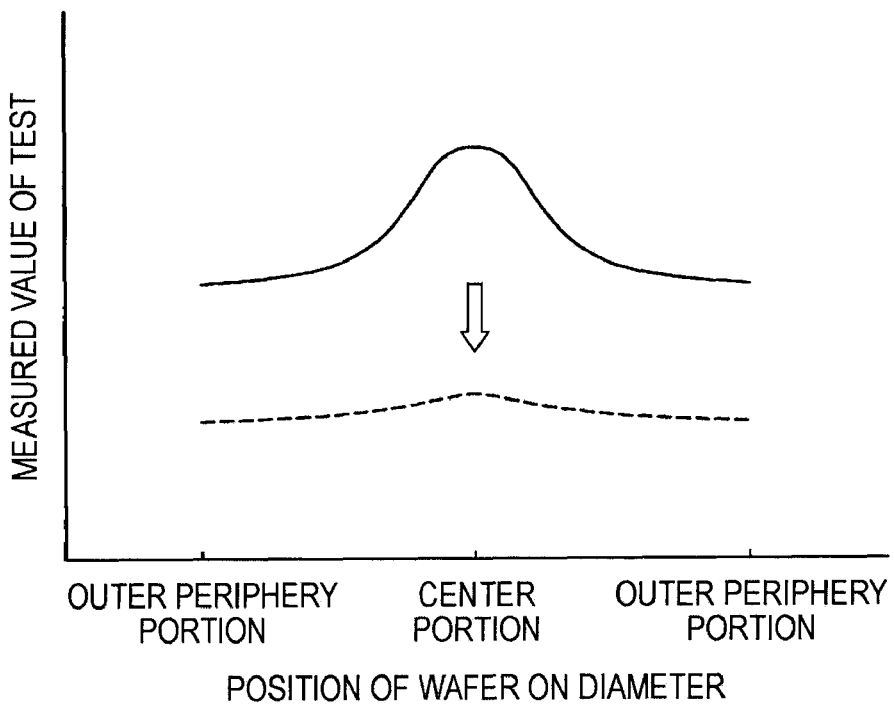
FIG. 11 is a graph showing the distribution of the operating characteristics on a wafer, according to an embodiment of the invention.

In addition, at least one of the apparatus configurations shown in FIGS. 5 and 6 can be applied to the apparatus configuration shown in FIG. 7. In addition, to alleviate the deviation of distribution of the operating characteristics of the MEMS wafer 40 within the face as shown in FIG. 11 by using the distribution of the flow amounts of the etching gas EG inside the chamber 32 in the structure etching process can be applied to the apparatus configurations shown in FIGS. 5 and 6. For example, the method described with reference to the apparatus shown in FIG. 7 may be performed by controlling the rotation of the support base 41 of the apparatus shown in FIG. 5 or the rotation of the gas ejecting head 42 of the apparatus shown in FIG. 6. In addition, instead of the nozzles 33a of the apparatuses shown in FIG. 5 or 6, a plurality of nozzles 43 that can control the gas ejection amounts may be disposed on the gas ejecting head 42.

Figure 8:
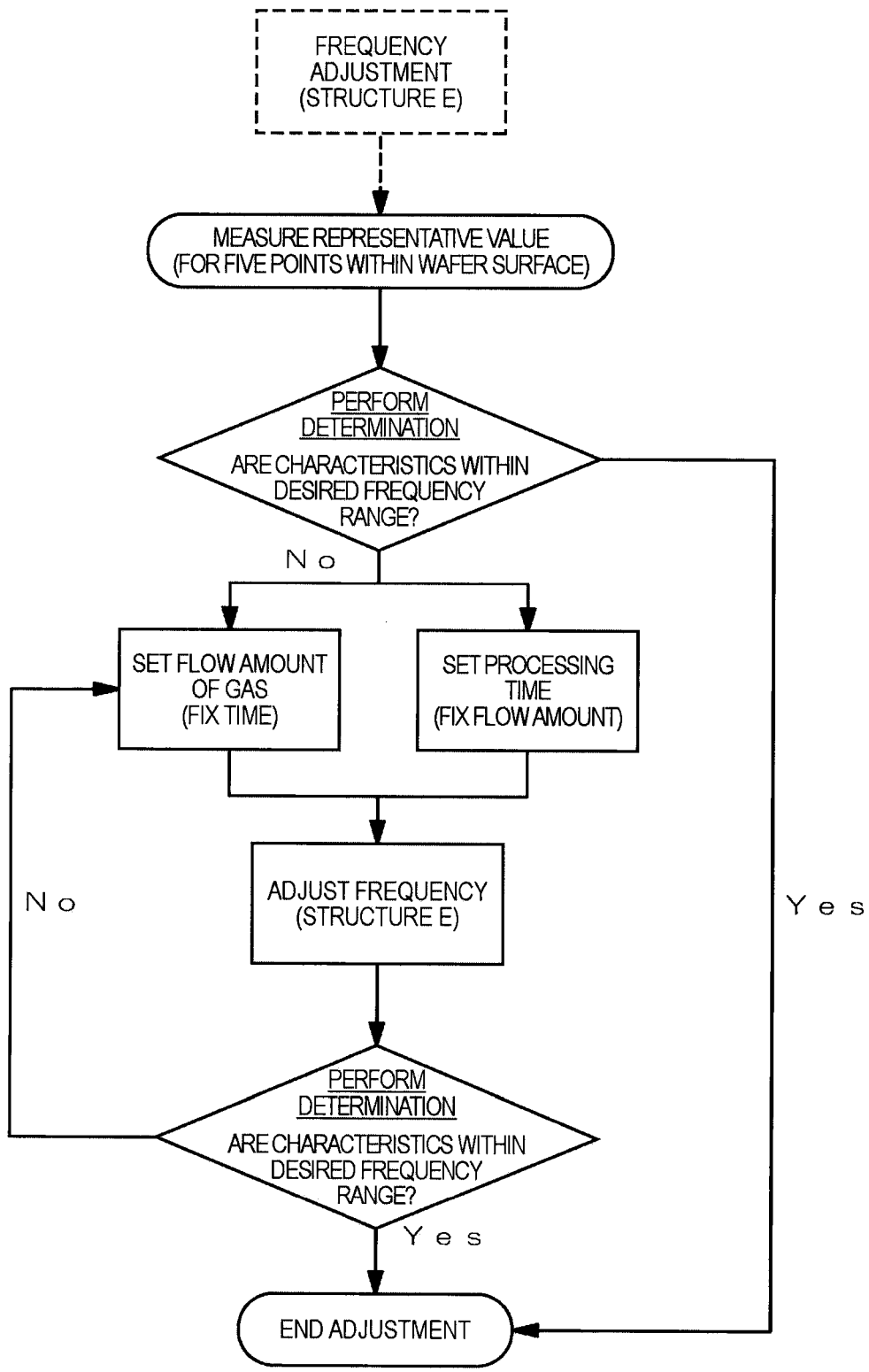
FIG. 8 is a schematic flowchart showing an example of the procedure of an adjustment process according to an embodiment of the invention.

FIG. 8 shows the procedure of an adjustment process that is performed so as to include an operating characteristic testing process in a case where the structure etching process is performed by using the process apparatuses shown in FIGS. 5 to 7 or a process apparatus acquired by appropriately combining the process apparatuses. When the structure etching process is performed simultaneously for the MEMS wafer 40 (cases shown in FIGS. 5 to 7), the structure etching process (denoted by a dotted line in the figure) is temporarily stopped, and the operating characteristic detecting process is performed. Then, a determination on whether to perform the structure etching process again or perform the next process can be considered to be made based on the test result.

In such a case, as shown in FIG. 8, tests are performed for MEMS structures 20 located in a plurality of spots on the MEMS wafer 40. Then, for example, a representative value (an average value, the most frequent value, a median value, or the like) of the test results is calculated. The test result is compared with a reference value so as to determine whether the representative value is within a predetermined allowed range as the reference value used as its center, whether a predetermined ratio or more of the test results for the plurality of spots is included in the allowed range, or the like, and it is determined whether an additional structure etching process needs to be performed. Then, when it is determined that the structure etching process is not necessary, for example, as in cases where the resonance frequency is within the allowed frequency range or the like, the adjustment process is completed, so that the next process (in this embodiment, an opening/closing process for closing the opening 15a of the lid body 15Y) is performed.

On the other hand, when the additional structure etching process is determined to be necessary based on the result of the determination, at least one of the flow amount of the etching gas EG and a time for surface etching is set based on the relation between the test result and the reference value or the allowed range, and the structure etching process is performed again. Here, in a case where the time for surface etching is fixed in the structure etching process performed again, only the flow amount of the etching gas EG needs to be set. On the other hand, in a case where the flow amount of the etching gas for surface etching is fixed, only the time for surface etching needs to be set. However, both the flow amount of the etching gas EG and the time for surface etching may be configured to be variable, and in such a case, the flow amount and the time are set by using an appropriate method depending on the situation.

When the repeated surface etching is completed, the test and the determination that are the same as those described above are repeated, and the above-described procedure is repeated. Then, the adjustment process finally ends.

In addition, in the above-described case, the operating characteristic testing process may be performed by extracting the MEMS chip 30 or the MEMS wafer 40 from the chamber 32 once. Alternatively, the operating characteristic testing process may be performed in the state in which the MEMS chip 30 or the MEMS wafer 40 is maintained to be inside the chamber 32. In addition, the method shown in FIG. 8 may be used in a case where the structure etching process is individually performed for the one or the plurality of MEMS chips 30 (the case shown in FIG. 4).

In FIG. 8, the case where the operating characteristic testing process is performed after the structure etching process is performed once, and the etching process to be repeated is performed based on the determination made in the process has been described. However, as described above, the operating characteristic testing process may be performed before the structure etching process as long as it is after the on-substrate structure forming process. In other words, in FIG. 8, the operating characteristic testing process (measurement of the representative value) is performed immediately after the on-substrate structure forming process without performing the structure etching process denoted by the dotted line in the figure, and the time for surface etching or the flow amount of the etching gas is set in a frequency adjusting process of the structure etching process performed thereafter.

Figure 10A:
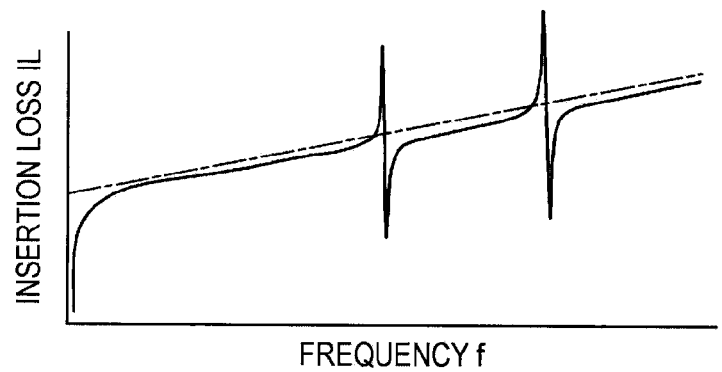
FIGS. 10A and 10B are graphs showing the measurement results of frequency characteristics of insertion loss according to an embodiment of the invention.
Figure 10B:
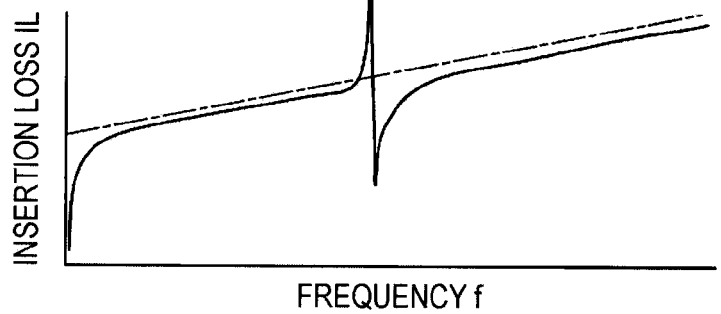

Also in a case where the structure etching process is performed by using the process apparatuses shown in FIGS. 5 to 7 or a process apparatus acquired by appropriately combining the apparatuses, as shown in FIG. 9, differently from the method shown in FIG. 8, the operating characteristics of the MEMS structure 20 of each MEMS chip 30 can be detected in the structure etching process. However, in such a case, a dummy wiring (not shown; a wiring, for example, that is formed in an area which is lost at a time when the MEMS chip 30 is divided, or in a shorted-wire area and does not have a function in a completed MEMS chip 30) that is connected to each MEMS chip 30 in parallel is arranged in the MEMS wafer 40, and a common terminal connected to the dummy wiring is connected to the test device 38 through the probe 36 and the wiring 37. In such a case, the operating characteristics measured by the test device 38 represent a plurality of resonance points when represented by a graph of the frequency (f) and the insertion loss (IL) as the frequency characteristics, as shown in FIG. 10A. At this moment, by performing the structure etching process so as to alleviate the deviation of the distribution of the operating characteristics (resonance frequency) within the MEMS wafer 40 as shown in FIG. 11, the deviation of the frequency characteristics is decreased. Accordingly, the frequency characteristics as shown in FIG. 10B can be acquired.

In addition, it may be configured that the dummy wiring is disposed in correspondence with each MEMS structure 20, a set of the dummy wirings are drawn out to a partial area (for example, an area such as an outer peripheral portion to be discarded) of the MEMS wafer 40, and a terminal group configured by arranging a plurality of terminals corresponding to each set of the dummy wirings in the partial area is formed. In such a case, by arranging a test head having a probe group corresponding to the terminal group and connecting the test head to the test device 38, the plurality of MEMS structures 20 can be individually tested in an independent manner.

Figure 12:
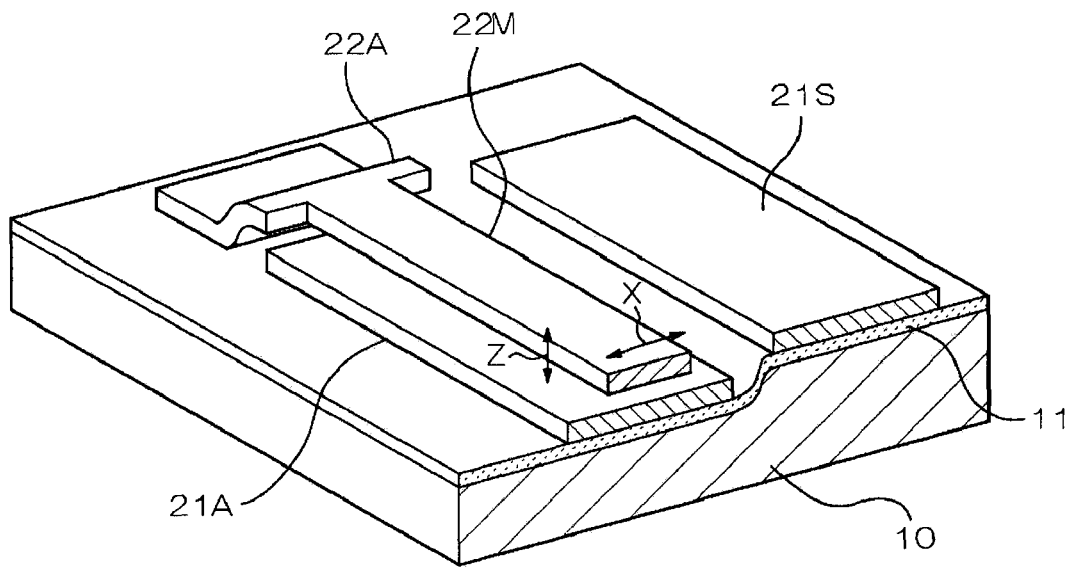
FIG. 12 is a schematic perspective view showing another example of an MEMS structure according to an embodiment of the invention.

In the test method used in the above-described operating characteristic testing process, the operating characteristics of the MEMS structure 20 that is in the original operational state are tested. However, the invention is not limited thereto. For example, as shown in FIG. 12, not only the fixed electrode 21A is disposed on the lower side of the movable portion 22M of the movable electrode 22A, but also an auxiliary electrode 21S is arranged on the side of the movable portion 22M. Then, in the operating characteristic testing process, the frequency characteristics of the movable portion 22M may be measured by applying a voltage between the movable electrode 22A and the auxiliary electrode 21S so as to vibrate the movable portion 22M in the horizontal direction X. In such a case, the vibration mode (a mode for vibration in the horizontal direction X) of the movable portion 22M in the operating characteristic testing process is different from a vibration mode (a mode for vibration in the vertical direction Z) of the movable portion 22M in the actual operation of the MEMS device. However, when the relative relation between the two vibration modes is acquired in advance, the operating characteristic testing can be performed without any problem by measuring a different value relating to the operating characteristics of the MEMS structure 20.

In addition, as a method used in the operating characteristic testing process, the movable portion 22M may be operated by using a driving method that differs from that for the actual operation of the MEMS structure such as a method in which the movable portion 22M of the MEMS structure 20 is mechanically vibrated by applying vibration externally to the MEMS device, and static capacitance between the fixed electrode 21A and the movable electrode 22A of the MEMS structure 20 at that moment is measured or the like.

As described above, according to this embodiment, surface etching is performed by supplying an etching gas EG to the periphery (the hollow portion 20C) of the MEMS structure 20 after configuring the periphery of the MEMS structure 20 to be in the ventilation state with the outside in the on-substrate structure forming process. Accordingly, the structural size of the MEMS structure 20 can be adjusted in a broad range. In addition, since the surface etching is performed in a gas phase, etching can be performed more uniformly even for an MEMS structure 20 having a delicate and complicated structure. Accordingly, occurrence of adverse effects in the operation of the MEMS structure due to the etching can be avoided, and a variance in the operational aspects such as a change in the vibration mode due to adjustment of a partial structural size or the like can be prevented.

In particular, in a case where the movable portion 22M which can be operated is arranged in the MEMS structure 20, the movable portion 22M tends to have a structure having a broader surface area on the substrate 10, for example, a structure in which the front and rear faces are exposed together in the example shown in the figure. Accordingly, it is possible to adjust effectively and uniformly the structural size by performing the surface etching that is performed in the gas phase. In addition, since the gas-phase etching is used, even when the surface etching is performed for the MEMS structure 20 disposed inside the hollow portion 20C, the deviation in the uniformity of the etching does not easily occur.

In addition, in this embodiment, the operating characteristic testing process is included in which a test for the operating characteristics of the MEMS structure 20 is performed, and whether to perform the surface etching further is determined by comparing the test result with a reference value. Accordingly, an MEMS device having the operating characteristics within the allowed range corresponding to the reference value can be manufactured in accordance with the structural size of the MEMS structure formed in the on-substrate forming process. In addition, since the MEMS structure 20 is disposed inside the hollow portion 20C, it is difficult to check directly the etched state by external visual recognition. However, in this embodiment, the operating characteristic testing process is included, and accordingly, there is an advantage that the effect of the surface etching can be checked from the characteristic side.

In addition, in this embodiment, the MEMS structure 20 has the movable portion 22M that can be operated, and the test is performed in a state in which the movable portion 22M operates in the operating characteristic testing process. Accordingly, compared to a case where the operating characteristics are tested without operating the movable portion 22M, the operating characteristics of the MEMS structure having the movable portion 22M can be tested accurately with high precision.

In addition, in this embodiment, the MEMS structure 20 is configured by a silicon layer, and accordingly, a device can be formed by using general semiconductor manufacturing technology. Therefore, reduction in the manufacturing costs, miniaturization of the device, improvement of the performance, and the like can be achieved.

In addition, since the etching gas EG used for the surface etching of the MEMS structure 20 is $XeF_2$, etching of the silicon layer by using $XeF_2$ is isotropic etching. Accordingly, the exposed surfaces of the MEMS structure 20 can be etched uniformly, whereby the variance in the operational aspects can be reduced further. In addition, since the etching rate of $XeF_2$ for a silicon oxide film, a silicon nitride film, and aluminum is extremely low, there is no problem of etching the above-described materials that are used in an etching stopping layer, a wiring layer, and an electrode layer in the release etching for the sacrifice layer and the interlayer insulating film in the semiconductor manufacturing technology. Accordingly, the process can be designed without considering adverse effects due to the surface etching, and a time for the surface etching and other conditions can be set over a broad range.

However, as the etching gas EG, $Cl_2$, a mixed gas of $Cl_2$ and HBr, a mixed gas of $Cl_2$ and $O_2$, a mixed gas of $CF_4$ and $O_2$, $SF_6$, a mixed gas of $Cl_2$ and $N_2$, a mixed gas of $Cl_2$ and HCl, a mixed gas of HBr, $Cl_2$, and $SF_6$, $C_4F_8$, $CBrF_3$, a mixed gas of $SiCl_4$ and $Cl_2$, and a mixed gas of $SF_6$, $N_2$, and Ar, a mixed gas of $BCl_2$, $Cl_2$, and Ar, or the like can be used.

When the MEMS structure 20 is made of silicon nitride ($Si_3N_4$), as the etching gas, $CF_4$, a mixed gas of $CF_4$ and $O_2$, a mixed gas of $CF_4$ and $H_2$, a mixed gas of $CHF_3$ and $O_2$, $C_2F_6$, a mixed gas of $CHF_3$, $O_2$ and $CO_2$, a mixed gas of $CH_2F_2$ and $CF_4$, or the like can be used.

On the other hand, when the MEMS structure 20 is made of silicon oxide ($SiO_2$), as the etching gas, $CF_4$, a mixed gas of $C_4F_8$, $O_2$, and Ar, a mixed gas of $C_5F_8$, $O_2$, and Ar, a mixed gas of $C_3F_6$, $O_2$, and Ar, a mixed gas of $C_4F_8$ and CO, a mixed gas of $CHF_3$ and $O_2$, a mixed gas of $CF_4$ and $H_2$, or the like can be used.

On the other hand, when the MEMS structure 20 is made of aluminum (Al), as the etching gas, a mixed gas of $BCl_3$ and $Cl_2$, a mixed gas of $BCl_3$, $CHF_3$, and $Cl_2$, a mixed gas of $BCl_3$, $CH_2$ and $Cl_2$, a mixed gas of B, $Br_a$, and $Cl_2$, a mixed gas of $BCl_3$, $Cl_2$, and $N_2$, a mixed gas of $SiO_4$ and $Cl_2$, or the like can be used.

On the other hand, when the MEMS structure 20 is made of copper (Cu), as the etching gas, $Cl_2$, a mixed gas of $SiCl_4$, $Cl_2$, $N_2$, and $NH_3$, a mixed gas of $SiCl_4$, Ar, and $N_2$, a mixed gas of $BCl_3$, $SiCl_4$, $N_2$, and Ar, a mixed gas of $BCl_3$, $N_2$, and Ar or the like can be used.

On the other hand, when the MEMS structure 20 is made of an organic material (photoresist, polyimide resin, or the like), as the etching gas, $O_2$ plasma can be used in a case where plasma etching is used.

In this embodiment, the operating characteristic testing process is performed in parallel with surface etching during the structure etching process, the surface etching is stopped in a case where the operating characteristics correspond to the allowed range corresponding to the reference value, and the structure etching process is performed by using gas-phase etching. Accordingly, the operating characteristics can be tested in real time. In addition, when the operating characteristics are tested and determined to be in correspondence with the allowed range, the surface etching is stopped, whereby the operating characteristics can be adjusted more accurately. In addition, the MEMS structure 20 has the movable portion 22M, and as the movable portion 22M is operated during the gas-phase etching, the etching gas is agitated. Accordingly, there is an advantage that the uniformity of the surface etching for the movable portion 22M is improved further, and the etching rates of the portion configured as narrow little portions, that is, the surface of the fixed electrode 21A and a face of the movable portion 22M facing the fixed electrode 21A that face each other with a small gap interposed therebetween are increased further. Furthermore, by vibrating the movable portion all the time while the surface etching is performed, the reproducibility of the etching rate is improved further. In particular, in this embodiment, since the MEMS structure 20 is disposed inside the hollow portion 20C, it is difficult to check directly the degree of the surface etching from the outside by visual recognition or the like. However, by performing testing of the operating characteristics in real time during the surface etching, the etching state can be controlled accurately, which is a notable advantage.

In this embodiment, the MEMS device is an MEMS resonator that vibrates the movable portion 22M of the MEMS structure 20, and the operating characteristics are frequency characteristics. Accordingly, by vibrating the movable portion 22M in the structure etching process, there is an advantage in that the agitation action for the etching gas can be improved further.

In addition, in this embodiment, by introducing the etching gas EG into the inside of the hollow portion 20C through the opening 15a of the lid body 15Y, the structure etching process can be performed without any problem. In addition, by closing the opening 15a of the lid portion 15Y in the opening closing process, the hollow portion 20C in which the MEMS structure 20 is housed can be sealed. Accordingly, in a case where a manufacturing process in which a plurality of chips is processed in units of one wafer and then the chips are divided is employed as in a general semiconductor manufacturing process, the sealing of the MEMS structure 20 can be performed in units of one wafer. Therefore, a sealing operation performed in units of one chip can be omitted.

In addition, the method of manufacturing the MEMS device according to an embodiment of the invention is not limited to the above-described examples shown in the drawings, and various modifications can be made therein without departing from the basic concept of the invention. For example, in the above-described embodiment, the MEMS resonator has been described as an example of the MEMS device. However, the MEMS device according to an embodiment of the invention may be applied to various MEMS devices such as a micro actuator, a pressure sensor, an acceleration sensor, a micromirror device, a micro switch, and an ink jet head.

The entire disclosure of Japanese Patent Application No. 2009-005408, filed Jan. 14, 2009 is expressly incorporated by reference herein.

What is claimed is:

1. A method of manufacturing an MEMS device, the method comprising:
    forming a covering structure having an MEMS structure and a hollow portion, which is located on a periphery of the MEMS structure and is opened to an outside, on a substrate, the MEMS structure including a movable electrode facing a fixed electrode through a gap between the movable electrode and the fixed electrode, the gap being filled by a first sacrifice layer;
    performing surface etching for the MEMS structure by supplying an etching gas to the periphery of the MEMS structure from the outside that removes the first sacrifice layer from the gap between the movable electrode and the fixed electrode; and
    performing a test on operating characteristics of the MEMS structure and determining whether to perform additional surface etching by comparing a result of the test with a reference value, after the forming of the covering structure on the substrate,
    wherein the step of performing the test on operating characteristics is performed in parallel with the surface etching during the step of performing surface etching for the MEMS structure, and
    wherein the surface etching is stopped when the operating characteristics correspond to a range corresponding to the reference value.

2. The method of manufacturing an MEMS device according to claim 1, wherein the movable electrode is operable to vibrate, and wherein, in the step of performing the test on operating characteristics, the test is performed in a state in which the movable electrode is vibrated.

3. The method of manufacturing an MEMS device according to claim 1, wherein the MEMS structure is configured by a silicon layer, and the etching gas is $XeF_2$.

4. The method of manufacturing an MEMS device according to claim 1, wherein the MEMS device is a MEMS resonator that vibrates the movable electrode of the MEMS structure, and wherein the operating characteristics are frequency characteristics.

5. The method of manufacturing an MEMS device according to claim 4, wherein the step of performing the test on operating characteristics is performed in parallel with the surface etching during the step of performing surface etching for the MEMS structure by vibrating the movable electrode all the time, and wherein the surface etching is stopped when the operating characteristics correspond to the range corresponding to the reference value.

6. The method of manufacturing an MEMS device according to claim 1, further comprising:
    closing an opening of a lid body after the step of performing surface etching for the MEMS structure,
    wherein the step of forming the covering structure includes:
        forming the MEMS structure together with the first sacrifice layer on the substrate;
        forming a second sacrifice layer that configures at least a part of the covering structure on the upper side of the MEMS structure;
        forming the lid body that has the opening on the second sacrifice layer; and
        eliminating the first sacrifice layer and the second sacrifice layer through the opening of the lid body, releasing the movable electrode from the fixed electrode, and forming the hollow portion on the periphery of the MEMS structure, and
    wherein the performing of surface etching for the MEMS structure is performed by introducing the etching gas into an inside of the hollow portion through the opening of the lid body.

7. The method of manufacturing a MEMS device according to claim 1, wherein performing the step of performing the test on operating characteristics of the MEMS structure in parallel with the step of performing surface etching increases the etching rate of the first sacrifice layer due to agitation of the etching gas by the movable electrode during the test on operating characteristics.

* * * * *